United States Patent [19]
Hur

[11] Patent Number: 5,773,323
[45] Date of Patent: Jun. 30, 1998

[54] PACKAGE FOR SOLID STATE IMAGE SENSING DEVICE AND METHOD FOR MANUFACTURING THEREOF

[75] Inventor: Ki-Rok Hur, Cheongju, Rep. of Korea

[73] Assignee: LG Semicon Co., Ltd., Chungcheongbuk-do, Rep. of Korea

[21] Appl. No.: 639,648

[22] Filed: Apr. 29, 1996

[30] Foreign Application Priority Data

Apr. 27, 1995 [KR] Rep. of Korea .................. 1995-10041

[51] Int. Cl.$^6$ .................................................. H01L 21/60
[52] U.S. Cl. ........................................ 438/123; 438/121
[58] Field of Search .................................. 437/209, 214, 437/215, 216, 217, 2, 3; 257/680, 204; 428/123, 124, 121, 122, 126

[56] References Cited

U.S. PATENT DOCUMENTS

| 5,258,576 | 11/1993 | Neumann et al. | 257/704 |
| 5,315,153 | 5/1994 | Nagai et al. | 257/704 |
| 5,343,076 | 8/1994 | Katayama et al. | 257/704 |
| 5,357,056 | 10/1994 | Nagano | 257/680 |
| 5,357,139 | 10/1994 | Yaguchi et al. | 257/666 |
| 5,434,357 | 7/1995 | Belcher et al. | 257/704 |
| 5,471,011 | 11/1995 | Maslakow | 257/204 |
| 5,534,725 | 7/1996 | Hur | 257/680 |

FOREIGN PATENT DOCUMENTS

| 60-141178 | 6/1985 | Japan . | |
| 61-299537 | 12/1986 | Japan . | |
| 2-101776 | 4/1990 | Japan | 257/680 |
| 5-343658 | 12/1993 | Japan | 257/680 |

*Primary Examiner*—Kevin Picardat
*Attorney, Agent, or Firm*—Loudermilk & Associates

[57] ABSTRACT

A package such as for an image sensing device includes the device, which preferably is a solid state image sensing device converting an optical image to an electric signal, metal bumpers formed on the bonding pads of the image sensing device, leads electrically connected to the bumpers, a dielectric wall hermetically sealing the connection areas of the leads and the bumpers, and surrounding the circumference of a light-receiving region of the image sensing device, a glass lid attached onto the dielectric wall and thereby sealing the light-receiving region, and a package body enclosing the structure except the top surface of the glass lid and an exterior portion of the leads. A method is disclosed which may have the following steps: (1) forming metallic bonding bumpers on bonding pads of an image sensing device, and disposing inner leads on the bonding bumpers and electrically connecting the inner leads to the bonding pads; (2) forming a dielectric wall that hermetically seals the connection areas of the leads and the bumpers in the circumference of a light-receiving region of the image sensing device; and (3) attaching a glass lid that transmits light onto the light receiving region within the dielectric wall, and molding a package body by using a molding compound.

19 Claims, 2 Drawing Sheets

PACKAGE FOR SOLID STATE IMAGE SENSING DEVICE AND METHOD FOR MANUFACTURING THEREOF

FIELD OF THE INVENTION

The present invention relates to packages for solid state image sensing devices and methods for manufacturing thereof, and in particular to such devices and methods in which plastic packages are manufactured without bonding wire.

BACKGROUND OF THE INVENTION

A package for a solid state image sensing device, such as a "CCD" (Charge Coupled Device), which is widely used as an image sensing device in a video camera, etc., is illustrated in FIG. 1.

Each image sensing or CCD chip 1 is sawed to a certain size and attached to paddle region 6 of a lead frame by using conductive adhesives 7. Dielectric wall 2, which is a dielectric film or a resin wall, is formed on the surface of the chip between bonding pads 10 and light-receiving region 9, and for electrical interconnection wire-bonding is then performed so that bonding pads 10 are interconnected to leads 5 by wire 4. Thereafter, transparent glass lid 3 is attached onto dielectric wall 2, and package body 8 is formed by a molding step in which the surface of glass lid 3 is open at its top surface of molding compound (as is known in the art, glass lid 3 is transparent and serves to enable light to be transmitted to a light receiving region of the image sensing device). Trimming and forming processes are then performed, and thus the plastic package for the image sensing device is produced.

In such conventional packages for a solid state image sensing device, since the dielectric wall is formed on the surface of the chip in the space between the bonding pads and the light-receiving region, it is considerably difficult to form the dielectric wall, which must have a certain area and height, in the considerably narrow space (about 250 micrometers). Furthermore, since wire-bonding is utilized for the interconnections, a large space limitation is introduced.

SUMMARY OF THE INVENTION

The present invention is directed to address such above-described problems of such conventional techniques.

Accordingly, it is an object of the present invention to provide a package for an image sensing device wherein leads connected to the outside circuit connect directly to bonding pads formed on the image sensing device by metal bumpers formed on the bonding pads. A dielectric wall is formed to seal the connection areas of the leads and the bumpers.

A package for a semiconductor chip in accordance with the present invention includes a semiconductor chip having one surface whereon metal bumpers are formed, leads connected directly to the metal bumpers respectively, a glass lid located above the surface of the semiconductor chip, and a package body enclosing the semiconductor chip, an edge portion of the glass lid, and an inner part of the leads. The semiconductor chip may be a solid state image sensing device for converting an optical image on a light-receiving region to an electric signal through the metal bumpers. Between the glass lid and an area where the metal bumpers are located, a dielectric wall is formed of a dielectric polymer, and the polymer is an adhesive dielectric thermoset-polymer to improve attachment to the image sensing device and the glass lid.

It is an another object of the present invention to provide a method which may include the steps of: (1) forming metallic bonding bumpers on bonding pads of an image sensing device, and disposing inner leads on the bonding bumpers and thereby electrically connecting the inner leads to the bonding pads; (2) forming a dielectric wall which hermetically seals the connection areas of the leads and the bumpers in the circumference of a light-receiving region of the image sensing device; and (3) attaching a glass lid which transmits light onto the light receiving region (within the dielectric wall), and molding a package body by using a molding compound.

BRIEF DESCRIPTION OF THE DRAWINGS

The above objects and other advantages of the present invention will become more apparent by describing in detail preferred embodiments of the present invention with reference to the attached drawings in which.

DETAILED DESCRIPTION OF THE PREFERRED EMBODIMENTS

Referring to FIGS. 2 through 5, preferred embodiments of the present invention will be described in detail.

Figure 1:
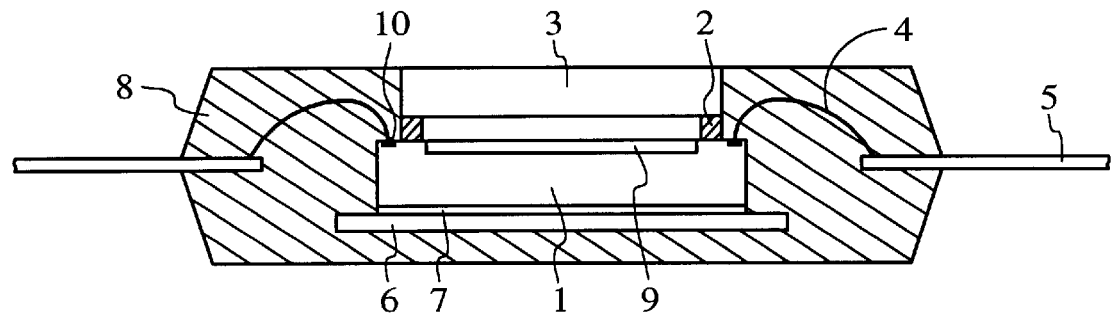
FIG. 1 is a sectional view of a conventional package for a solid state image sensing device.
Figure 2:
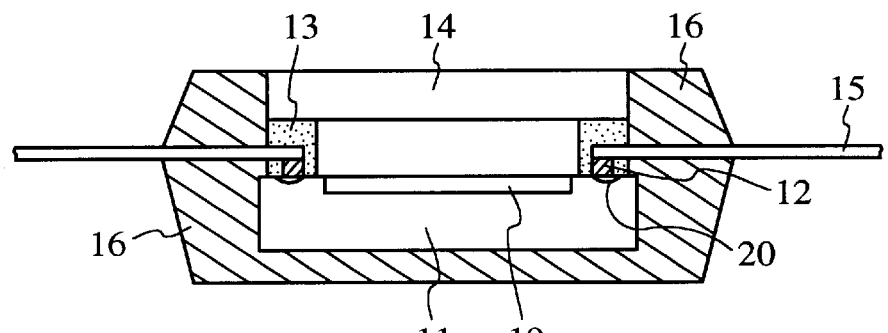
FIG. 2 is a sectional view for a preferred embodiment of a package for a solid state image sensing device in accordance with the present invention.
Figure 3A:
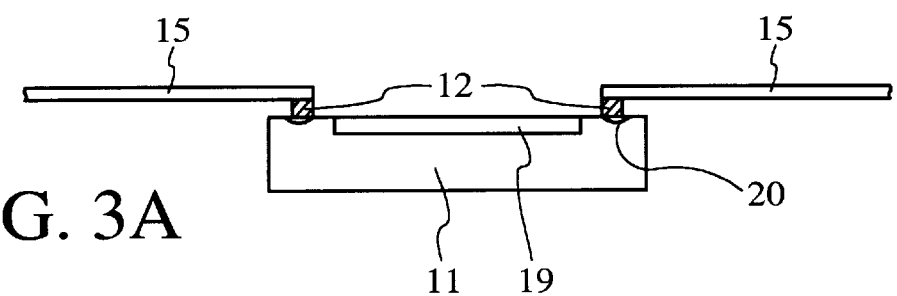
FIGS. 3A to 3D are sectional views of a preferred embodiment for illustrating steps in the manufacture of a package in accordance with the present invention.

In connection with a method for manufacturing a package in accordance with the present invention, as illustrated in FIG. 3A, metallic bonding bumpers 12 are formed on bonding pads 20 of image sensing device (semiconductor chip) 11, and inner leads 15 are positioned on and bonded to bonding bumpers 12 by a pressure welding (or other metal bonding technique), and thereby an electrical connection is accomplished.

Figure 3B:
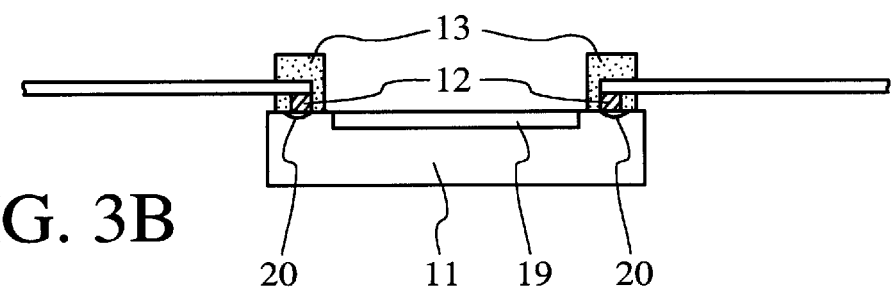
Figure 4:
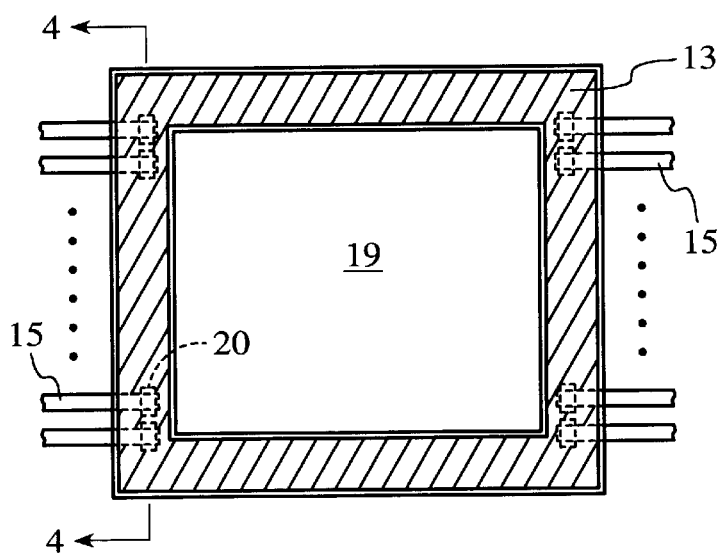
FIG. 4 is a plane view of the structure of the step illustrated in FIG. 3C.
Figure 5:
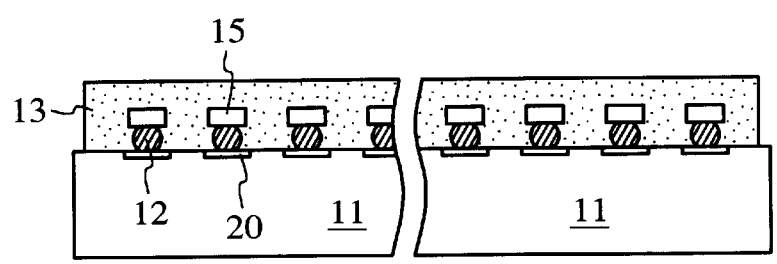
FIG. 5 is a sectional view taken along line 4—4 of FIG. 4.

Thereafter, as illustrated in FIGS. 3B, 4 and 5, in order to form dielectric wall 13, which covers lead connection portions and has a certain volume and height, in the top surface of the chip but not light-receiving region 19, dielectric wall formation region is defined using a photoresist mask. A polymer (for example polyimide) is coated so that dielectric wall 13 is formed in the desired location. This polymer in the preferred embodiment is an adhesive dielectric thermoset-polymer, which may improve attachment to the image sensing device and the glass lid. The melting point of the bonding bumper material should be higher than that of the polymer. Alternatively, a suitable dielectric wall may be deposited and subsequently patterned by a photoresist mask.

As another example, there is a practicable method in which bumpers are first formed on inner leads 15, and dielectric wall 13 is formed thereon using a polymer in such a manner that the dielectric wall encloses a connection portion of the lead and bumpers except for a part of the bumpers to be bonded to the bonding pads of the chip. Then, the dielectric wall is attached to a bonding pad portion of the chip to attach each of the exposed portions of the bumpers to the bonding pads of the chip by a heat treatment. The melting point of the bonding bumper material should be lower than that of the polymer.

Figure 3C:
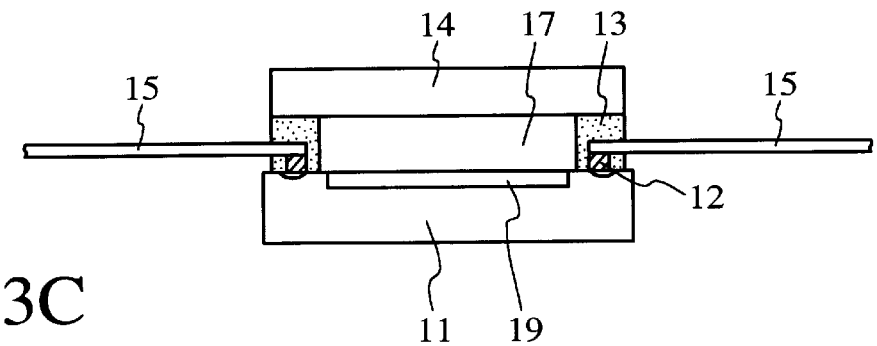
Figure 3D:
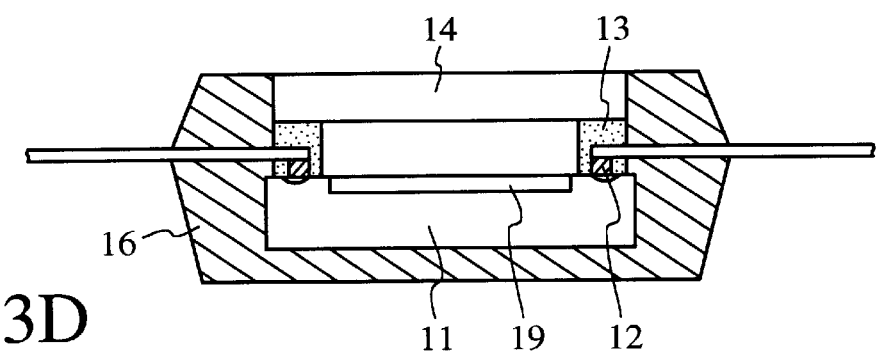

Subsequently, as illustrated in FIG. 3C, high light-transmission glass lid 14 is attached onto the dielectric wall, and thereby cavity 17 having a certain space above the device is formed. Successively, package body 16 is formed in a mold designed in a predetermined and desired shape, by a resin molding step in which the top surface of the package body is arranged at a top surface of the glass lid (i.e., in a planar or substantially coplanar manner as illustrated in FIG. 3D).

Remaining processes, such as trimming and forming leads, are carried out, thereby completing the manufacture of a package in accordance with the present invention.

The polymer to form the dielectric wall may be a polyimide or a photoresist, and provides electrical insulation between inner leads, and prevents molding compound from flowing in the light-receiving region in the molding process. Regarding quality, the polymer preferably is, in order to improve attachment to the image sensing device and the glass lid, an adhesive dielectric thermoset-polymer.

In a package in accordance with the present invention manufactured by a method such as that described above, the bumper bonding is used instead of the wire bonding of conventional techniques, which can result in a decrease of the thickness of the bonding region, and a reduction in the size of the package, and an improvement in the electrical performance.

Since the polymer to form the dielectric wall may be coated on overall surface of the chip but not the light-receiving region, the design margin for the dielectric wall may be widened, and thereby the width and thickness of the wall may be controlled more easily, and the distance between the light-receiving region and the glass lid may be determined by the thickness of the dielectric wall.

Furthermore, the dielectric wall of the present invention may more effectively prevent the molding compound from flowing into the light-receiving region in the molding process as compared to certain conventional packages because the dielectric wall of the present invention may be formed with a larger size in the width and thickness than that of such conventional packages.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method of manufacturing a solid state image sensing device, comprising the steps of:
   (1) forming metallic bonding bumpers on bonding pads of an image sensing device, and disposing inner leads on the bonding bumpers, wherein the inner leads are electrically connected to the bonding bumpers;
   (2) forming a dielectric wall sealing the connection of the leads and bumpers in a dielectric wall formation region around a circumference of a light-receiving region of the image sensing device, wherein the dielectric wall formation region is defined with a photoresist mask, wherein the dielectric wall comprises a polymer formed by coating; and
   (3) attaching a glass lid which transmits light onto the image sensing device with the dielectric wall, and molding a package body with a molding compound.

2. The method of claim 1, wherein the dielectric polymer comprises polyimide or photoresist.

3. The method of claim 1, wherein the dielectric polymer comprises an adhesive dielectric thermosetting polymer to firmly adhere to the image sensing device and the glass lid.

4. The method of claim 1, wherein a cavity is formed under the glass lid above the light receiving region.

5. The method of claim 1, wherein the image sensing device comprises a charge coupled device in a video camera.

6. A method for manufacturing an image sensing device having a light receiving region and bonding pads outside of the light receiving region, comprising the steps of:
   forming bonding bumpers on the bonding pads;
   bonding leads on the bonding bumpers, wherein the leads are electrically connected to the bonding pads;
   forming a dielectric wall in a dielectric wall formation region of the image sensing device, wherein the dielectric wall formation region is defined with a photoresist mask outside of the light receiving region, wherein the dielectric wall covers the bonding bumpers, bonding pads and a portion of the leads where the leads are bonded to the bonding bumpers;
   attaching a transparent lid on the dielectric wall; and
   molding a package body covering the image sensing device, wherein the transparent lid is not covered with molding and transmits light onto the light receiving region of the image sensing device.

7. The method of claim 6, wherein the bonding bumpers comprise metal.

8. The method of claim 6, wherein the dielectric wall is formed by coating with a polymer.

9. The method of claim 8, wherein a melting point of the bonding bumpers is higher than a melting point of the polymer.

10. The method of claim 6, wherein the inner leads are bonded to the bumpers by pressure welding.

11. The method of claim 6, wherein a top surface of the package body is substantially coplanar with a top surface of the transparent lid.

12. The method of claim 6, wherein a cavity is formed under the transparent lid above the light receiving region.

13. The method of claim 6, wherein the image sensing device comprises a charge coupled device in a video camera.

14. A method for manufacturing an image sensing device having a light receiving region and bonding pads, comprising the steps of:
   forming bonding bumpers on leads, wherein the leads are electrically connected to the bonding bumpers;
   forming a dielectric wall on the leads and bonding bumpers, wherein the dielectric wall encloses the bonding bumpers and a portion of the leads including where the bonding bumpers are formed, wherein the dielectric wall is not formed on an exposed bonding portion of each of the bonding bumpers;
   attaching the dielectric wall to the image sensing device with a heat treatment, wherein the exposed bonding portions of the bonding bumpers are bonded to bonding pads of the image sending device;
   attaching a transparent lid to the dielectric wall; and
   molding a package body covering the image sensing device, wherein the transparent lid is not covered with molding and transmits light onto the light receiving region of the image sensing device.

15. The method of claim 14, wherein the dielectric wall comprises a polymer.

16. The method of claim 14, wherein a melting point of the bonding bumpers is higher than a melting point of the polymer.

17. The method of claim 14, wherein a top surface of the package body is substantially coplanar with a top surface of the transparent lid.

18. The method of claim 14, wherein a cavity is formed under the transparent lid above the light receiving region.

19. The method of claim 14, wherein the image sensing device comprises a charge coupled device in a video camera.

* * * * *